(12) United States Patent
Liu

(10) Patent No.: US 7,729,055 B2
(45) Date of Patent: Jun. 1, 2010

(54) METHOD AND APPARATUS PROVIDING CONCAVE MICROLENSES FOR SEMICONDUCTOR IMAGING DEVICES

(75) Inventor: Saijin Liu, Boise, ID (US)

(73) Assignee: Aptina Imaging Corporation, Grand Cayman (KY)

( * ) Notice: Subject to any disclaimer, the term of this patent is extended or adjusted under 35 U.S.C. 154(b) by 0 days.

(21) Appl. No.: 12/052,649

(22) Filed: Mar. 20, 2008

(65) Prior Publication Data
US 2009/0237801 A1     Sep. 24, 2009

(51) Int. Cl.
G02B 27/10     (2006.01)
(52) U.S. Cl. .................. 359/622; 359/619; 359/626
(58) Field of Classification Search ......... 359/619–622; 250/208.1, 214; 257/232, 233, 225, 292, 257/432, 294, 428; 438/340, 69, 70, 75, 438/151
See application file for complete search history.

(56) References Cited

U.S. PATENT DOCUMENTS

| | | | |
|---|---|---|---|
| 5,526,371 A | 6/1996 | Shmulovich et al. | 438/20 |
| 6,140,630 A | 10/2000 | Rhodes | 250/208.1 |
| 6,204,524 B1 | 3/2001 | Rhodes | 257/222 |
| 6,310,366 B1 | 10/2001 | Rhodes et al. | 257/185 |
| 6,326,652 B1 | 12/2001 | Rhodes | 257/231 |
| 6,333,205 B1 | 12/2001 | Rhodes | 257/215 |
| 6,376,868 B1 | 4/2002 | Rhodes | 372/68 |
| 7,068,432 B2 * | 6/2006 | Boettiger et al. | 359/619 |
| 7,106,519 B2 | 9/2006 | Aizenberg et al. | 359/620 |
| 7,196,388 B2 | 3/2007 | Wu | 257/431 |
| 7,218,452 B2 * | 5/2007 | Boettiger et al. | 359/619 |
| 7,307,788 B2 * | 12/2007 | Boettiger et al. | 359/619 |
| 2006/0183027 A1 | 8/2006 | Lin | 430/5 |
| 2006/0198008 A1 | 9/2006 | Li et al. | 359/227 |
| 2007/0148372 A1 | 6/2007 | Kim | 428/21 |
| 2007/0166849 A1 | 7/2007 | Shimizu et al. | 428/21 |

FOREIGN PATENT DOCUMENTS

WO    WO/2004/048285    10/2004

OTHER PUBLICATIONS

Wang, Jian Jim et al.; "Nano- and Microlens Arrays Grown Using Atomic-Layer Deposition," IEEE Photonics technology Letters, vol. 18, No. 24, Dec. 15, 2006; ieeexplore.ieee.org/xpls/abs_all.jsp?arnumber=4026616.
Vilkner, Torsten et al.; "Micro Total Analysis Systems. Recent Developments," Dept. of Chem., Imperial College London and Institute for Analytical Sciences, Dortmund, Germany; Anal. Chem, 2004, 76, pp. 3373-3386.
Bardinal, V. et al., "Fabrication and characterization of microlens arrays using a cantilever-based spotter," www.opticsexpress.org/viewmedia.cfm?id=134998&seq=0.

* cited by examiner

*Primary Examiner*—Mohammed Hasan
(74) *Attorney, Agent, or Firm*—Dickstein Shapiro LLP

(57) ABSTRACT

A method and apparatus providing an imaging device with a system of convex and concave microlenses at different levels over an array of photosensors. The concave microlenses redirect leaking light, which is not directed by the convex lenses onto the photosensors, onto the photosensors.

30 Claims, 17 Drawing Sheets

US 7,729,055 B2

METHOD AND APPARATUS PROVIDING CONCAVE MICROLENSES FOR SEMICONDUCTOR IMAGING DEVICES

FIELD OF THE INVENTION

The present invention relates to the field of semiconductor imaging devices, and particularly to microlenses used in such imaging devices.

BACKGROUND OF THE INVENTION

Imaging devices, including charge coupled devices (CCD) and complementary metal oxide semiconductor (CMOS) sensors, among others, have commonly been used in photo-imaging applications. Non-limiting examples of CMOS imaging circuits, processing steps for fabrication thereof, and the functions of their components are described, for example, in U.S. Pat. No. 6,140,630 to Rhodes, U.S. Pat. No. 6,376,868 to Rhodes, U.S. Pat. No. 6,310,366 to Rhodes et al., U.S. Pat. No. 6,326,652 to Rhodes, U.S. Pat. No. 6,204,524 to Rhodes, U.S. Pat. No. 6,333,205 to Rhodes, and U.S. Pub. No. 2006/0198008.

FIG. 1 is a circuit diagram illustrating a non-limiting example of a conventional four-transistor pixel cell 120 which may be used in a CMOS imaging device. During an integration period, light strikes the photosensor 124 to generate charges stored within an accumulation region of the photosensors. After the integration period and in response to a charge transfer signal TX, a charge transfer transistor 128 gates the photogenerated charges from the accumulation region to a storage node 126 which may be configured as a floating diffusion region. The transferred charges bias the gate, of a source follower transistor 132, which has a first terminal connected to a voltage source 130 (e.g., VDD) and a second terminal that transmits an output signal Vout indicating the amount of charge stored in the floating diffusion region 126. In response to a row select signal ROW, a row select transistor 134 gates the output signal Vout to a column line 136. In operation, the storage node 126 is reset by a turning on a reset transistor 142 connecting the voltage source 130 and the storage node 126, and a reset signal Vrst is consequently output as the output signal Vout. When the photosensor charge is transferred to the storage node 126 an image signal Vsig is output as the output signal Vout.

FIG. 2 is a block diagram illustrating a non-limiting example of a conventional CMOS imager system 40. As shown, the imager system 40 includes a pixel array 30 is connected to a row decoder/selector 42 and column bus 43 and a timing and control circuit 44 for controlling the row decoder/selector 42 and column bus 43. The output signals Vout (Vrst, Vsig) of the pixel cells are read out row-by-row. During readout, each pixel cell of a selected row transmits an output signal Vout, via its respective column line 136, to the column bus 43. The output signals Vout include the reset signal Vrst and the image signal Vsig, each of which are sent to a sample and hold circuit 45 controlled by the timing and control circuit 44. After the sample and hold circuit 45 acquires the reset Vrst and image Vsig signals for a pixel cell, those signals Vrst, Vsig are converted to a differential signal (Vrst-Vsig) by a differential amplifier 46, the differential signal (Vrst-Vsig) is digitized by a digitizer 47, and the digital pixel data is provided to an image processor 48.

FIG. 3 is a cross-section view illustrating a non-limiting example of a portion of a conventional microlens system 200, which may be used for a pixel array of an imaging device, including, but not limited to, that shown in FIG. 2. The FIG. 3 cross section is taken across a row of alternates red and green pixels in pixel array 30. As shown, respective convex microlenses 112 and color filters R, G of a Bayer color filter array are provided to each of two illustrated pixel cells 120 separated by isolation trenches 154. The Bayer color filter pattern provides a red, green, or blue filter to the pixel cells of a pixel array, such that only light of a respective wavelength range passes through a filter for detection. During image capture, a camera lens 111 transmits light of an image to the underlying convex microlenses 112, which in turn direct the light onto respective photosensors 124 of the pixel cells 120. In FIG. 3, for example, an incident light beam L1a is transmitted from point A of the camera lens 111 to the microlens 112 of the green pixel, and the light is then redirected as light beam L1b through the green filter G and onto to the right-side photosensor 124. When light contacts the photosensor 124 having a p-type region 124a and underlying n-type region 124b forming a photodiode, photogenerated electrons accumulate in the n-type region 124b.

Light may enter a desired pixel cell 120 but still fail to reach a respective photosensor 124. This may result, for example, from imperfections in the camera lens 111 and microlenses 112, from the arrangement of the camera lens 111 and microlenses 112, or from internal refractions within upper fabrication layers of an integrated circuit containing the pixel array 30. In FIG. 3, the camera lens 111 transmits a light beam L2a (again from point A) at an angle askew to the lens axis 113 of the receiving microlens 112. Consequently, the light beam L1a is redirected as a "leaking" light beam L2a (i.e., a light beam which is not aimed by a microlens 112 at a photosensor 124) and will not be detected. A microlens system for redirecting leaking light is desired.

DETAILED DESCRIPTION OF THE INVENTION

In the following description, reference is made to the accompanying drawings, which form a part of this disclosure and illustrate non-limiting embodiments of the invention. Structural, logical, and electrical modifications may be made without departing from the spirit and scope of the invention. Embodiments described herein relate to a method and apparatus, applicable to any type of solid state image sensor having a pixel cell array, for better capturing leaking light.

Initially, it should be noted that the terms "lens" and "microlens," as used herein, refers to an optical device for refracting light. The term "convex" describes a lens that directs light toward its lens axis. The term "concave" describes a lens that directs light away from its lens axis.

Figure 4A:
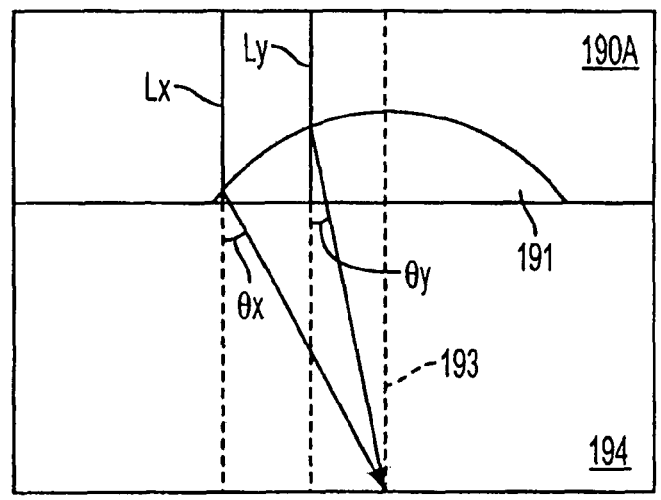
FIGS. 4A-B are diagrams respectively illustrating non-limiting examples convex and concave lens each having the same refractive index and plano-convex-shaped shape.
Figure 4B:
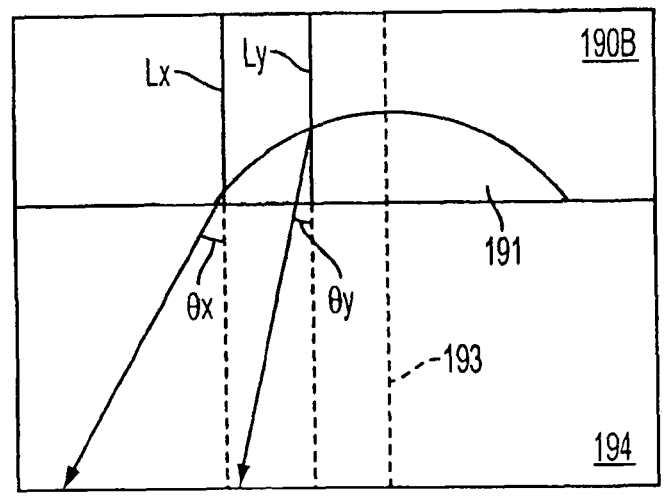

Referring to the drawings, where like elements are designated by like reference characters, FIGS. 4A and 4B respectively illustrate non-limiting examples of convex and concave lenses each having a plano-convex shape. Two properties of lenses should be apparent from a comparison of the lenses 191 in FIGS. 4A and 4B. First, the refractive properties of lenses depend not only on their own structural attributes, but upon those of their surrounding mediums as well. Second, while the terms "convex" and "concave" are sometimes uses to describe a lens shape, those terms are also used to describe whether a lens refracts light toward or away from its lens axis. This disclosure uses the terms "convex" and "concave" in this later respect, unless referring to a lens shape.

In FIG. 4A, when incident light Lx, Ly is transmitted through a medium 190A (e.g., a transparent layer or air) to the lens 191, the incident light. Lx, Ly refracts at the curved surface of the lens 191 toward the lens axis 193 because the refractive index of the medium 190A (e.g., n=1) is lower than the refractive index of the lens 191 (e.g., n=1.5). The refracted light continues in the same direction when leaving the lens 191 because the supporting medium 194 has the same refractive index (e.g., n=1.5).

In FIG. 4B, when the same incident light Lx, Ly is transmitted through another medium 190B (e.g., a transparent layer) to the plano-convex-shaped lens 191, the incident light Lx, Ly refracts at the curved surface of the plano-convex-shaped lens 191 in a direction away from the lens axis 193 because the refractive index of the medium 190B (e.g., n=2) is higher than the refractive index of the lens 191 and supporting medium 194.

In FIGS. 4A and 4B, because all factors other than the refractiveness of the mediums 190A, 190B are held equal (including the +/−0.5 differences between the refractive index of the lens 191 and each medium 190A, 190B), the lens 191 of FIG. 4A refracts the incident light beams Lx, Ly at angles θx and θy toward the lens axis 193 while the lens 191 of FIG. 4B refracts the incident light beams Lx, Ly at the same respective angles θx and θy away from the lens axis 193. The light beams Lx, Ly can be targeted by varying factors such as the shape and curvature of the lens 191, the relative refractive indexes of the lens 191 and mediums 190, 194, and the positioning of those elements 190, 191, 194. Those skilled in the art understand the se and further properties of microlenses. Consequently, a further discussion of those properties, which may be used to adjust angles of refraction, focal lengths, etc., is omitted.

Figure 3:
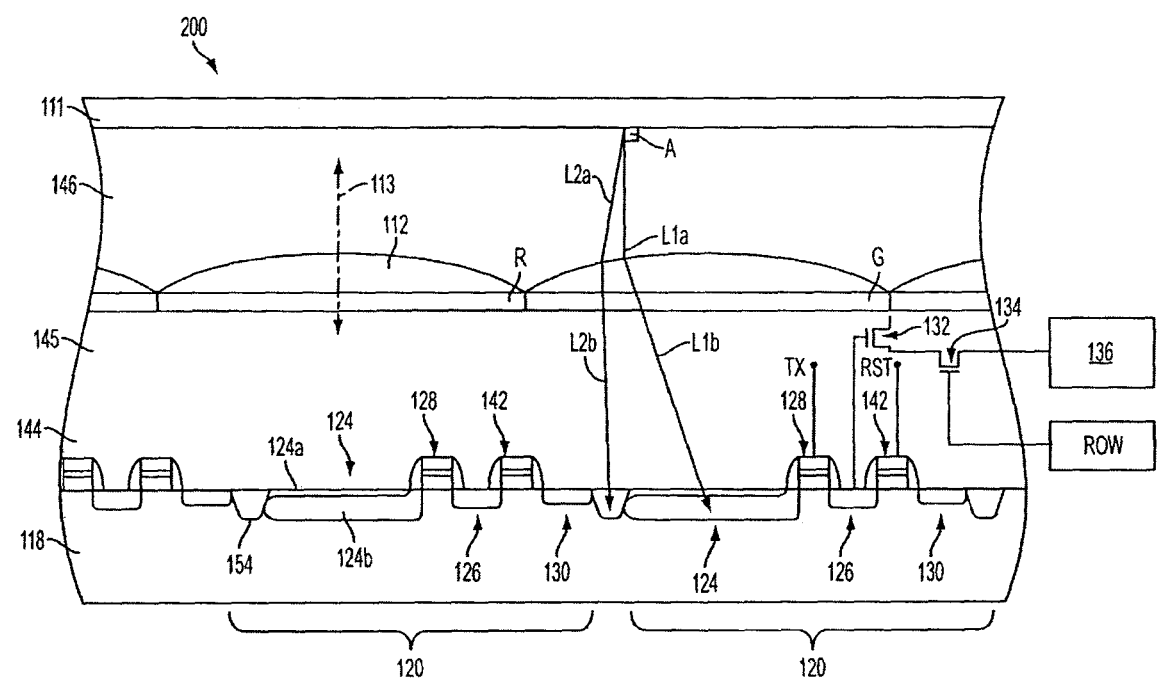
FIG. 3 is a cross-sectional view illustrating a conventional microlens system.
Figure 5:
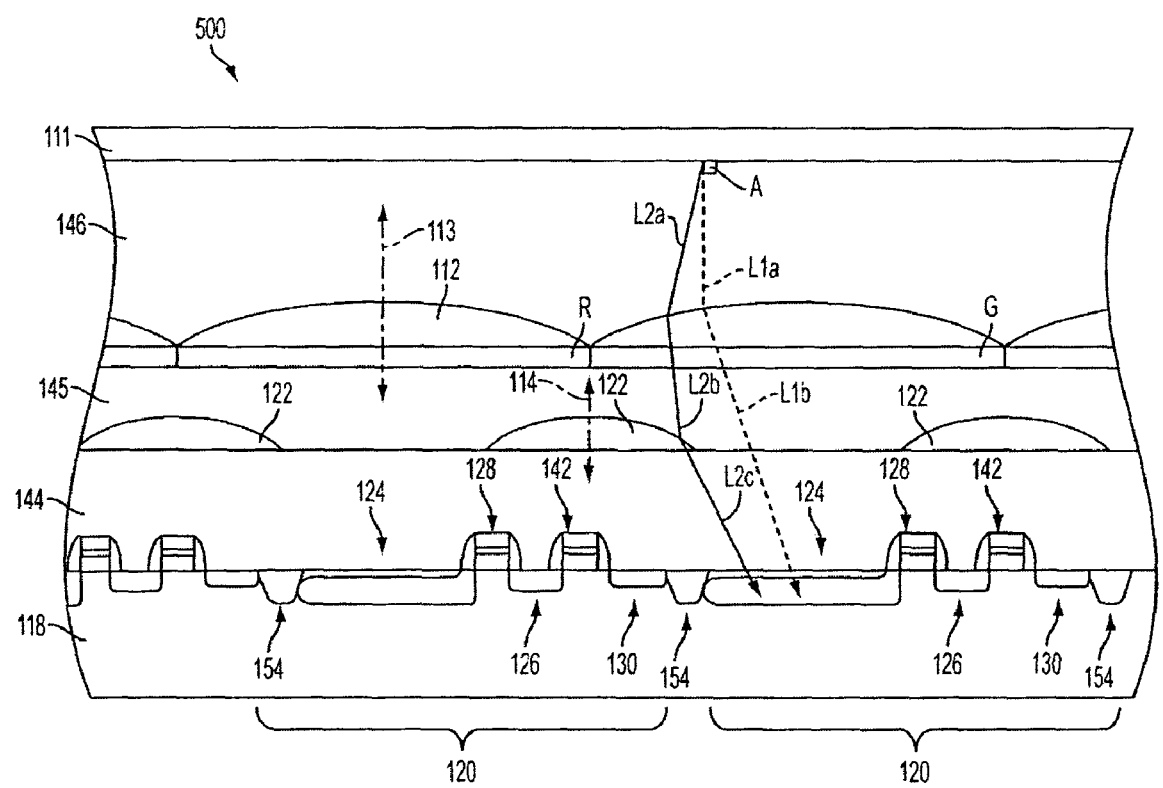
FIG. 5 is a cross-sectional view illustrating a microlens system in accordance with a first embodiment of the disclosure.

FIG. 5 is a cross-section view illustrating a non-limiting, example of a first embodiment of a microlens system 500 for redirecting leaking light. The microlens system 500 provides a plurality of concave microlenses 122 in addition to a plurality of convex microlenses 112 (hereinafter referred to as first microlenses 112 and second microlenses 122). The second microlenses 122 direct "leaking" light (e.g., light which is not aimed by the first microlens 112 at a photosensor 124) away, from their lens axes 114 onto the photosensors 124. For example, as shown in FIG. 5, a second microlens 122 redirects the leaking light beam L2b (previously described with reference to FIG. 3) as light beam L2c onto the right-side photosensor 124.

The light beam L2b is "leaking" in that, if not for the second microlens 122, it would not strike a respective photosensor 124. The term "leaking" is not intended to suggest that the second microlenses 122 can only serve as a corrective measure for redirecting astray light caused by defects (e.g., redirects only astray light caused by imperfections of the camera lens 111 or first microlenses 112). Rather, the second microlenses 122 may, by design, supplement the role of the first microlenses 112 in directing light to the photosensors 124. For example, the light team L2a may be askew from the lens axis 113 of the first microlens 112 because the camera lens 111 is smaller than the underlying array of pixel cells, such that the captured image is fanned out (by design) from the camera lens 111 to the larger array of pixel cells 120. In such an application, the light beams L2a, L2b, and L2c would represent an intended path of transmission for light emitted from point A of the camera lens 111. Light beams L1a and L1b (previously described with reference to FIG. 3) are shown as dashed lines for comparison.

Figure 6:
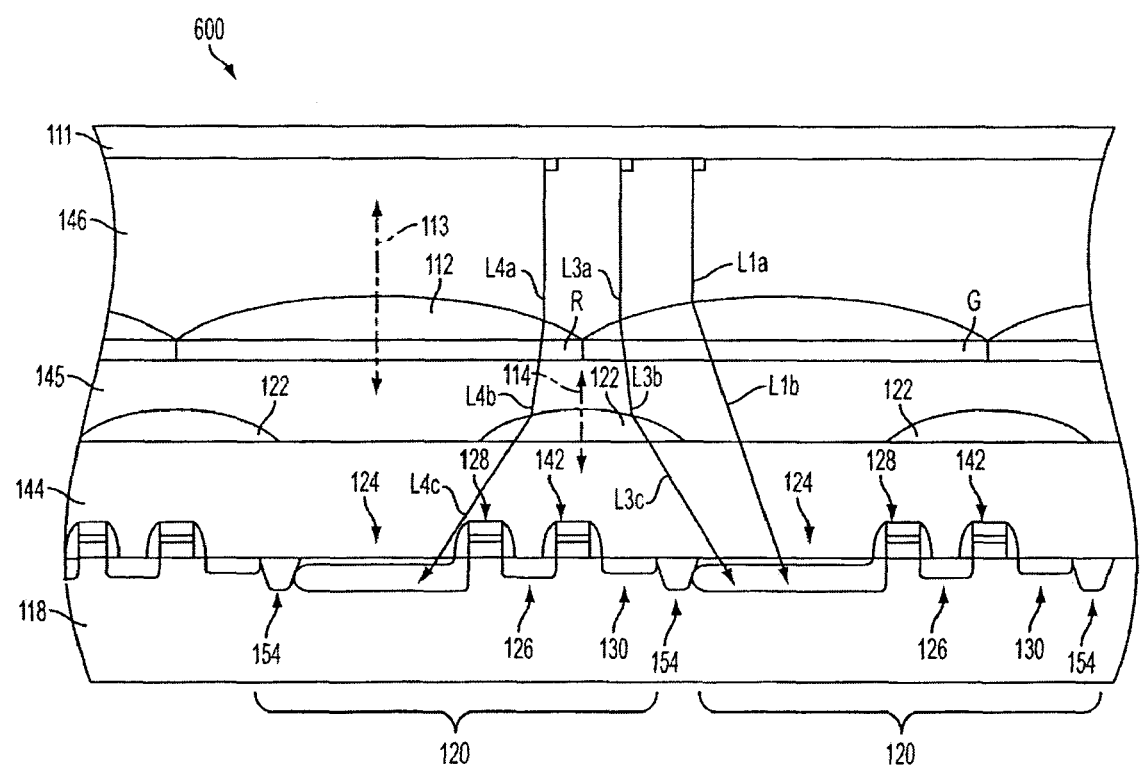
FIG. 6 is a cross-sectional view illustrating a microlens system in accordance with a second embodiment of the disclosure.
Figure 7A:
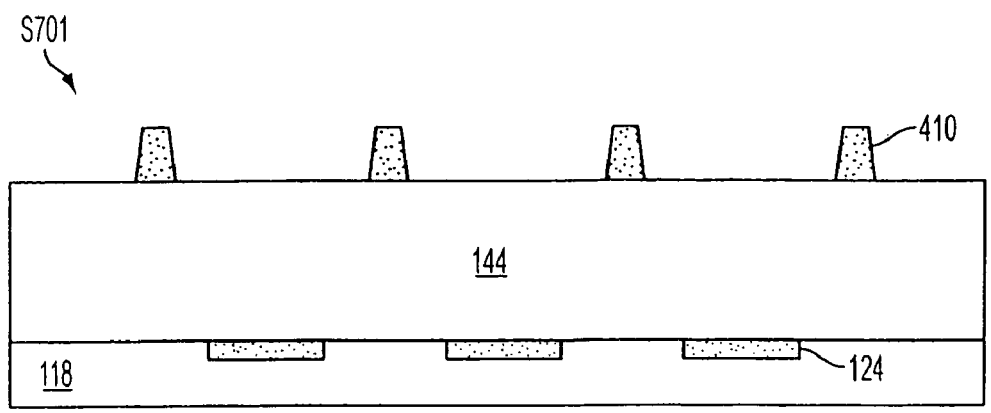
FIGS. 7A-E form a flow diagram illustrating a process for fabricating microlenses of FIGS. 5 and 6.
Figure 7B:
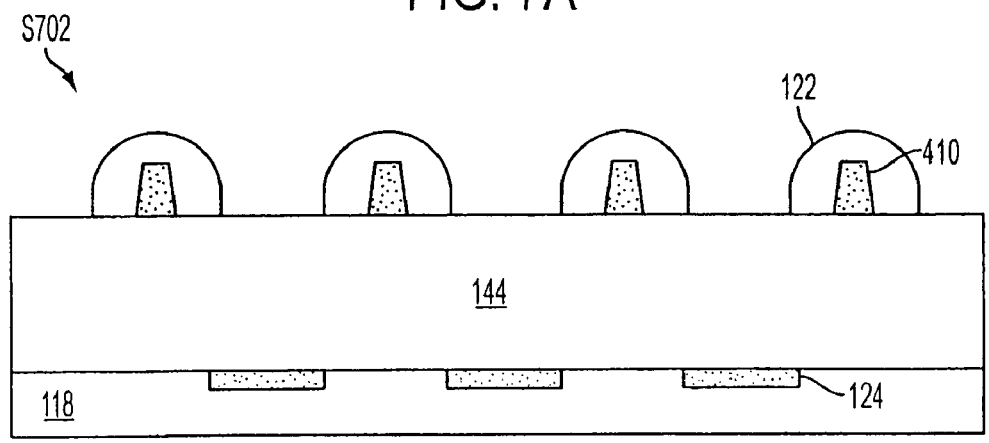
Figure 7C:
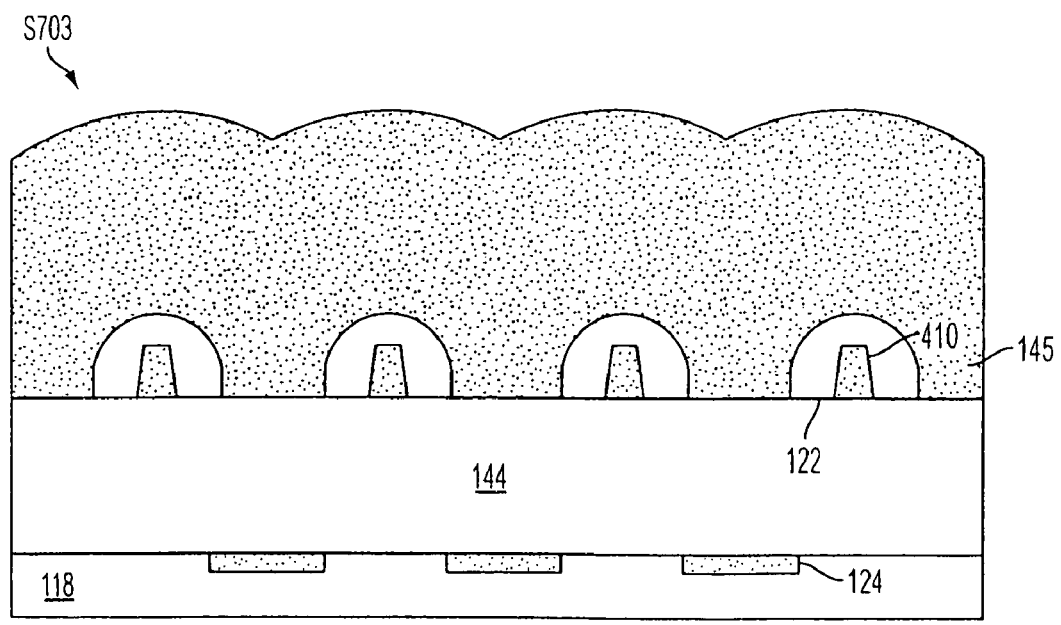
Figure 7D:
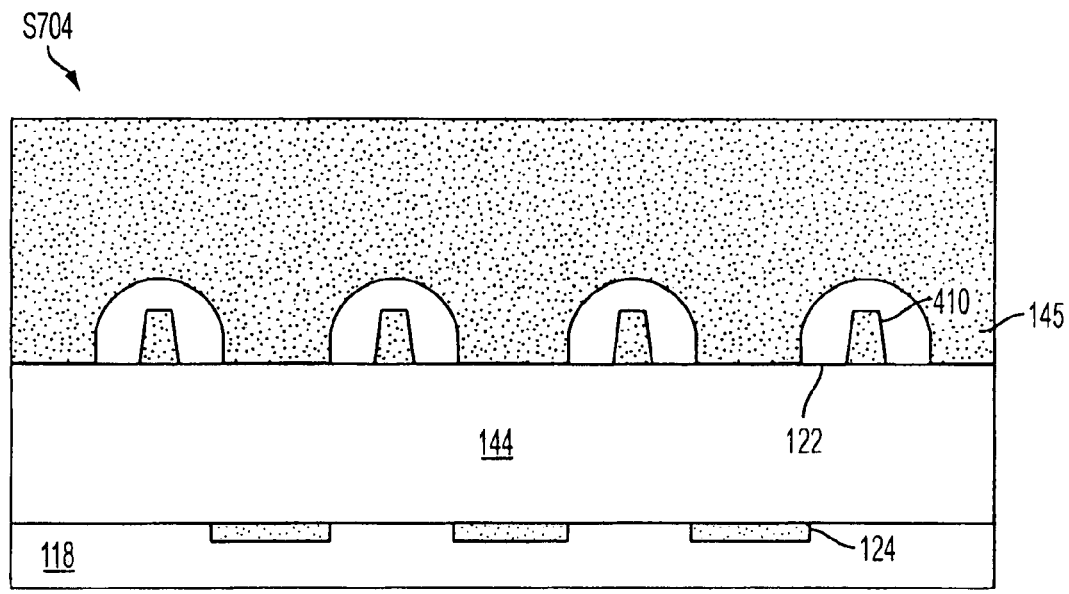
Figure 7E:
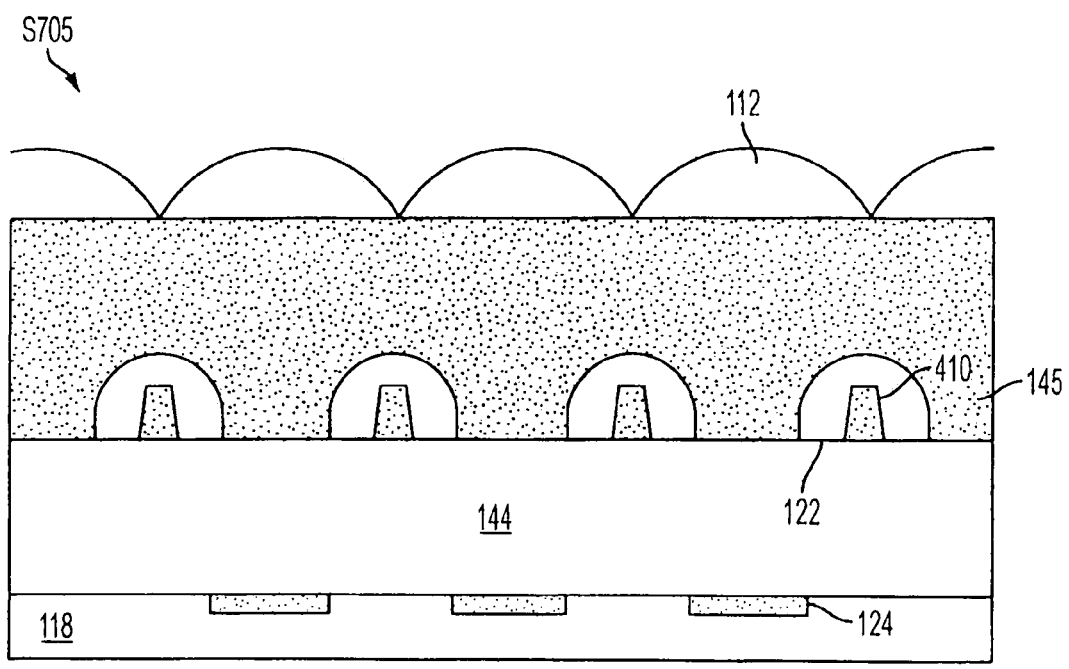

FIG. 6 illustrates a non-limiting example of a second embodiment of a microlens system 600 for redirecting leaking light. The second microlenses 122 supplement the role of the first microlenses 112 by redirecting leaking light transmitted through edge regions of the first microlenses 112. For example, a second microlens 122 redirects the leaking light beam L3b, as light beam L3c, onto the photosensor 124 of the green pixel cell 120; and also redirects the leaking light beam L4b, as light beam L4c, onto the photosensor 124 of the red pixel cell 120. As in conventional microlens systems, the camera lens 111 of the microlens system 600 transmits light beam L3a in a direction parallel to the lens axis 113 of the first microlens 112.

However, unlike in conventional microlens systems, the first microlens 112 is not refractive enough to direct the light beam L3a onto the photosensor 124 as light beam L3b. The second microlens 122 is therefore used to redirecting light beam L3b, as light beam L3c, onto the photosensor 124. Because of the supplemental role of the second microlens 122, the first microlens 112 can bend the light beam 123a at a lesser angle than would be otherwise required for photodetection. The first microlens 112 can therefore have a lower refractive index than would otherwise be required. Further, the photosensor 124 can be made smaller or placed closer to the first microlens 112 than could otherwise be achieved.

In the microlens systems 500, 600 of FIGS. 5 and 6, the positioning, shape, and refractive indexes of the first and second microlenses 112, 122, as well as the thicknesses and refractive indexes of the first, second, and third transparent layers 144-146, may be varied to adjust the respective focal lengths of the first and second microlenses 112, 122. Such adjustments may be based on the greatest angle of refraction at which the first and second microlenses 112, 122 are desired to redirect light, and based on the size and placement of the photosensors 124.

As shown in FIGS. 5 and 6, the first and second microlenses 112, 122 of the microlens systems 500, 600 each have a plano-convex shape, but the first and second microlenses 112, 122 are convex and concave lenses, respectively, as explained above. Similar to the plano-convex-shaped lens 191 of FIG. 4A, the convex first microlenses 112 have a higher refractive index than the overlying first transparent layer 146 (which may be merely an air pocket between the first microlenses 112 and the camera lens 111); and have the same refractive index as the underlying second transparent layer 145. Similar to the piano-convex-shaped lens 191 of FIG. 4B, the concave second microlenses 122 have a lower refractive index than the overlying second transparent layer 145 (which may entirely separate the first and second microlenses 112, 122); and have the same refractive index as the underlying third transparent layer 144 (which may entirely separate the second microlenses 122 and photosensors 124). These relative refractive indexes can be varied to modify the path of light transmission between the first microlenses 112 and the photosensors 124 (e.g., the second microlenses 122 need not have the same refractive index as the underlying third transparent layer 144).

FIGS. 7A-E are flow diagrams illustrating a non-limiting example of a process flow for fabricating the first and second microlenses 112, 122 on the second and third transparent layers 145, 144, respectively. Typically, microlenses are formed by patterning a microlens material into an array of separated blocks, and then subjecting the blocks to a reflow process in which they are melted into a plano-convex shape. The process flow of FIGS. 7A-E, on the other hand, uses atomic layer deposition ("ALD") to form the second microlenses 122.

In step 701 (FIG. 7A), wall-shaped ALD seed pillars 411) (hereinafter wall-shaped pillars 410) are deposited on the third transparent layer 144, e.g., on a layer, of silicon dioxide (SiO2; n=1.45), which is fabricated over the substrate layer 118 and imaging components of the pixel cells 120 (e.g., over the photosensor 124 and readout transistors 128 and 142). More particularly, the wall-shaped pillars 410 extend lengthwise between adjacent pairs of photosensors 124. In step 702 (FIG. 7B), the second microlenses 122, which may have the same or different refractive indices than the third transparent layer 144 (e.g., second microlenses 122 of silicon dioxide), are formed by ALD on the wall-shaped pillars 410A.

Unlike the first microlenses 112, which are formed later the second microlenses 122 are formed at locations above and between the photosensors 124. In positioning the second microlenses 122, the wall-shaped pillars 410 may be deposited on an optical aperture layer (not shown) of the pixel cells 120. Typically, a metal layer is patterned into both an optical aperture over the photosensors 124 and as part of the circuitry of the pixel cells 120 (e.g., as part of the readout circuitry) as well as for connecting a pixel array in peripheral circuits. The portions of the metal layer which form the optical aperture are "dummy" layers placed around the edges of the pixel cell 120, and the wall-shaped pillars 410 may be arranged on such portions of the metal layer where no metal is present.

In step 703 (FIG. 7C), the second microlenses 122 are covered with the second transparent layer 145 having a higher refractive index than the second microlenses 122, e.g., covered with a layer of tantalum pentoxide (Ta2O5; n=2.1), titanium dioxide (TiO2; n=2.25), or silicon nitride (Si3N4; n=1.9). In step 704 (FIG. 7D), the second transparent layer 145 is planarized or otherwise processed to form a flat upper surface. Finally, in step 705 (FIG. 7E), the first microlenses 112, which may have the same or different refractive indices than the second transparent layer 145 (e.g., first microlenses 112 of tantalum pentoxide, titanium dioxide, or silicon nitride), are formed on the second transparent layer 145 by ALD or a conventional deposit, pattern, and reflow process.

Various adjustments can be made to the positioning and optical characteristics of both the microlenses 112, 122 and transparent layers 145, 144 (e.g., changes to their positions and refractive indices with respect to another) to direct more light onto the photosensors 124. For example, if light is fanned out from the camera lens 111 to a pixel array 30, then the light may be received by the pixel cells 120 at different angles because of their different respective positions within the pixel array 30. The focal lengths and positions of the microlenses 112, 122 may be accordingly adjusted to account for these different angles at which the light is received by the pixel cells 120.

It should be noted that ALD is a conformal deposition technique by which pulses of gaseous reactants are used to deposit a film at an atomic level one layer at a time. One might expect that such a technique would result in a second microlens 122 having the same shape as the underlying seed pillar 410. However, it is known in the art of microlenses that curved lenses may be achieved, via ALD in the above process, by using constant-speed contour growth around sharp corners. As disclosed by Wang et al., Nano- and Microlens Arrays Grown Using Atomic-Layer Deposition, IEEE Photonics Technology Letters, Vol. 18, No. 24, Dec. 15, 2006, starting with a right angular corner, constant-speed contour growth can produce a rounded shape with a well-defined curvature. As further disclosed by the Wang reference, the shape of ALD-formed lenses depends on several factors including the geometry of the seed posts (e.g., the top width, slope angle, and depth of the seed post), the thickness of the consistant-speed growth layers deposited on the seed posts, and the distance between the seed posts.

Figure 8A:
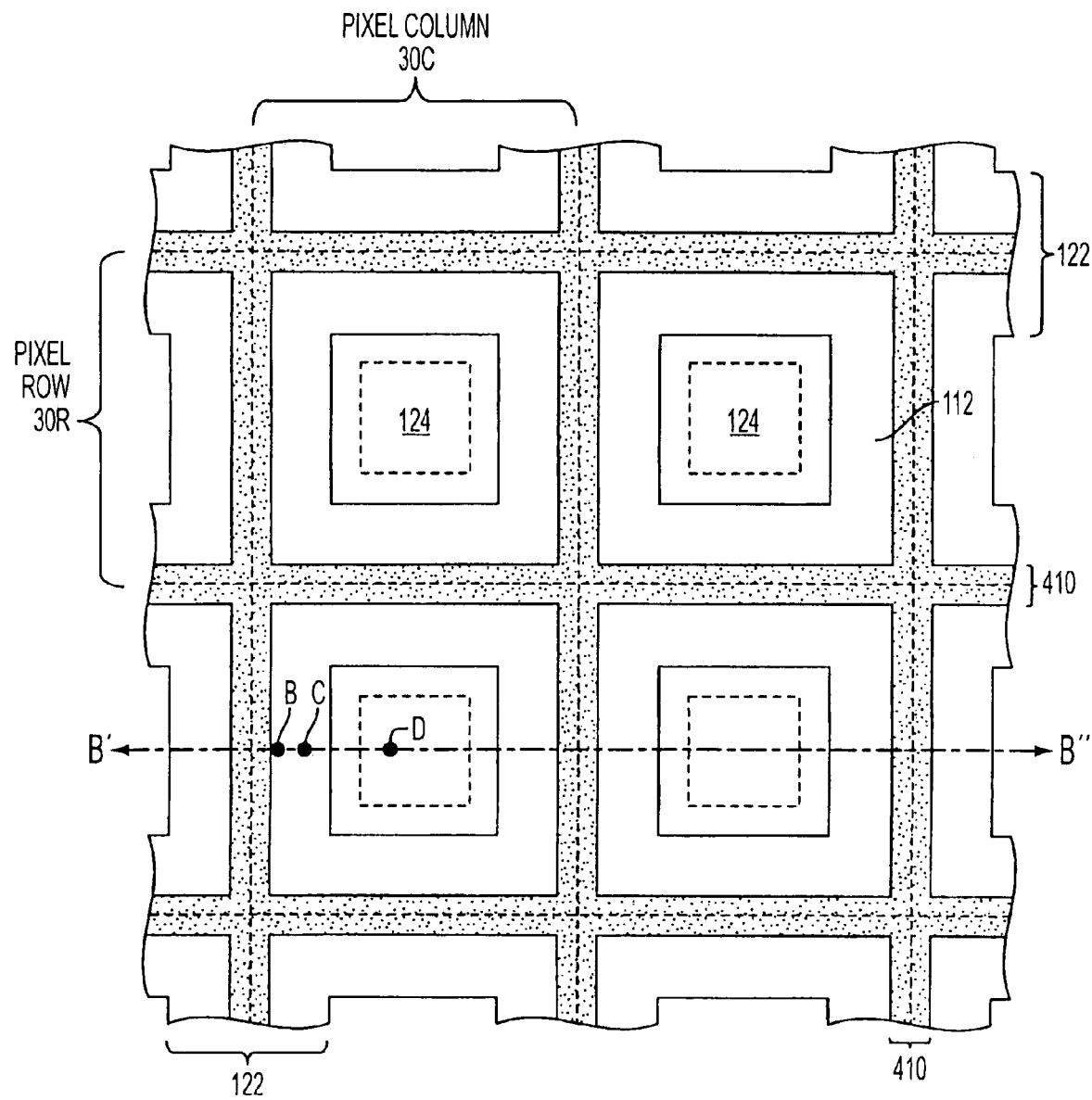
FIG. 8A is top-down view illustrating a layout for microlenses of FIGS. 5 and 6.
Figure 8B:
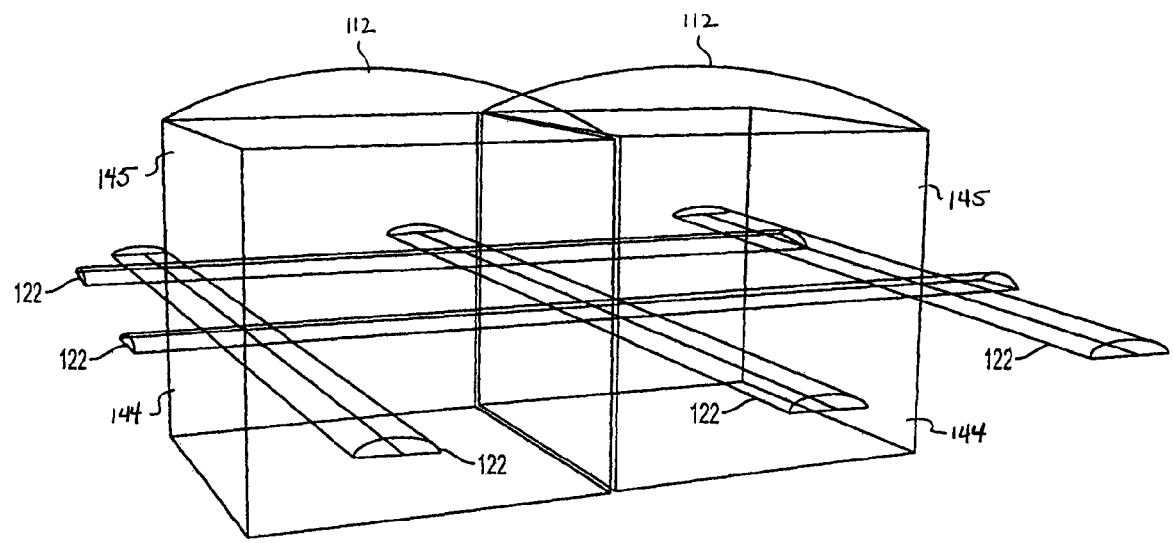
FIG. 8B is a three-dimensional view illustrating a layout similar to the layout of FIG. 8A.

FIG. 8A is a top-down view illustrating a non-limiting example of a layout for the second microlenses 122 of FIGS. 5 and 6, and the cross-sectional views of those microlens systems 500, 600 may be taken along the cross-section line B'-B". As noted above, the wall-shaped pillars 410 are formed lengthwise between the photosensors 124, e.g., along the edges of the pixel cells 120, and may span the distance between edges of a pixel cell array including the pixel rows 30R and columns 30C. The second microlenses 122 are formed by ALD on the wall-shaped pillars 410A, such that the second microlenses 122 have a split-rod shape with piano-convex cross-sections (e.g., like a pencil split length-wise and rested on its split surface). The lens axis 114 of such a split-rod second microlens 122 may be more particularly described as a plane running orthogonal to the illustrated page and bifurcating the respective wall-shaped pillar 410. FIG. 4B is a three-dimensional view illustrating a non-limiting (example of a layout similar to the layout of FIG. 8A. In FIG. 8B, for illustrative put poses, only the first and second microlenses 112, 122 and the second and third transparent layers 144, 145 are shown for two adjacent pixel cells 120.

The respective positions of the pixel cells 120, which are shown by the dashed lines, are indicated by the positions of the pixel rows 30R and pixel columns 30C. The first microlenses 112, which are not shown, would typically be centered over the photosensors 124 and entirely cover the respective pixels cells 120. As can be seen in this top-down view, incident light (e.g., orthogonal to the illustrated page of FIG. 8A) may pass through a first microlens 112 at a periphery region of a pixel cell 120, and then be redirected to an underlying second microlens 122. For example, incident light may enter a first microlens 112 at point B, be thereby redirected to enter a second microlens 122 at point D, and be thereby redirected to strike a photosensor 124 at point C. Such a transmission path of B-C-D may correspond, for example, to the light transmission path of light beams L3a, L3b, and L3c of FIG. 6.

Figure 8C:
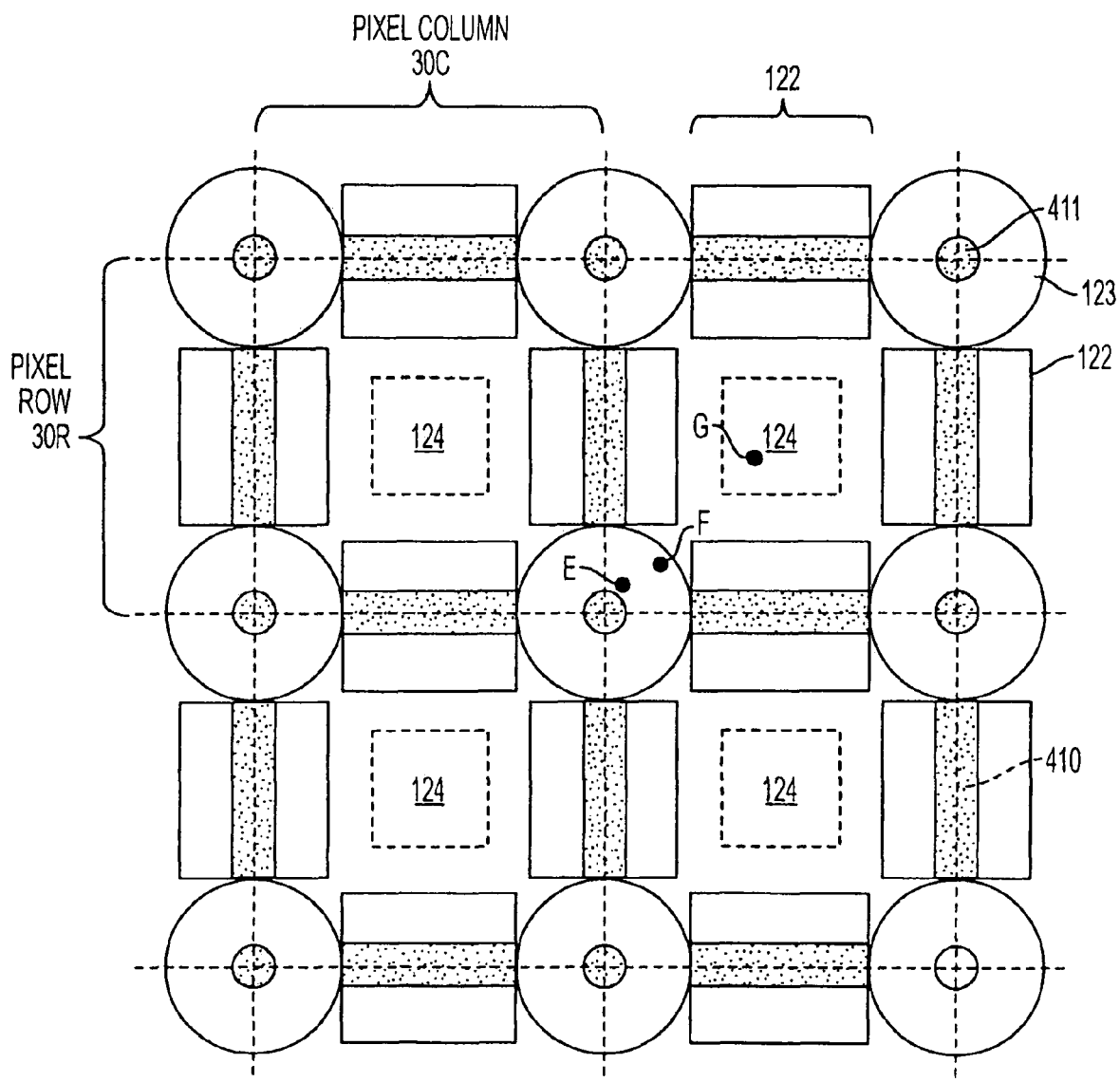
FIG. 8C is top-down view illustrating another layout for, microlenses of FIGS. 5 and 6.

FIG. 8C is a top-down view illustrating a non-limiting example of another layout for the second microlenses 122 of FIGS. 5 and 6. In this layout, the wall-shaped pillars 410 do not span the entire distance between edges of the pixel cells 120. Rather, a combination of column-shaped pillars 411 and wall-shaped pillars 410 are employed, such that the ALD process forms circular second microlenses 123 (e.g., like contact lenses) at the corners of the pixel cells 120 and split-rod second microlenses 122 spanning therebetween. Unlike the layout of FIG. 8A, the layout of FIG. 8C can redirect leaking light from the corners of the pixel cells 120 to the centered photosensors 124. For example, as shown, incident light may enter a first microlens 112 at point E, be thereby redirected to enter a second microlens 122 at point F, and be thereby redirected to strike a photosensor 124 at point G.

Figure 9A:
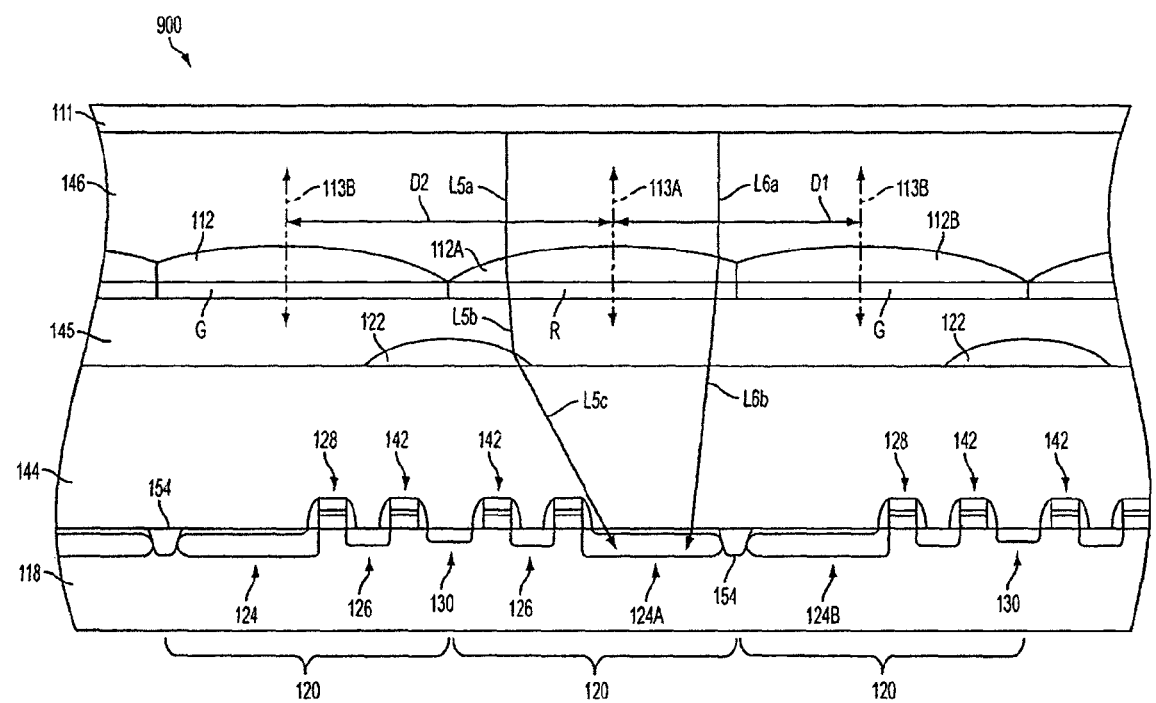
FIG. 9A is a cross-sectional view illustrating a microlens system in accordance with a third embodiment of the disclosure.
Figure 9B:
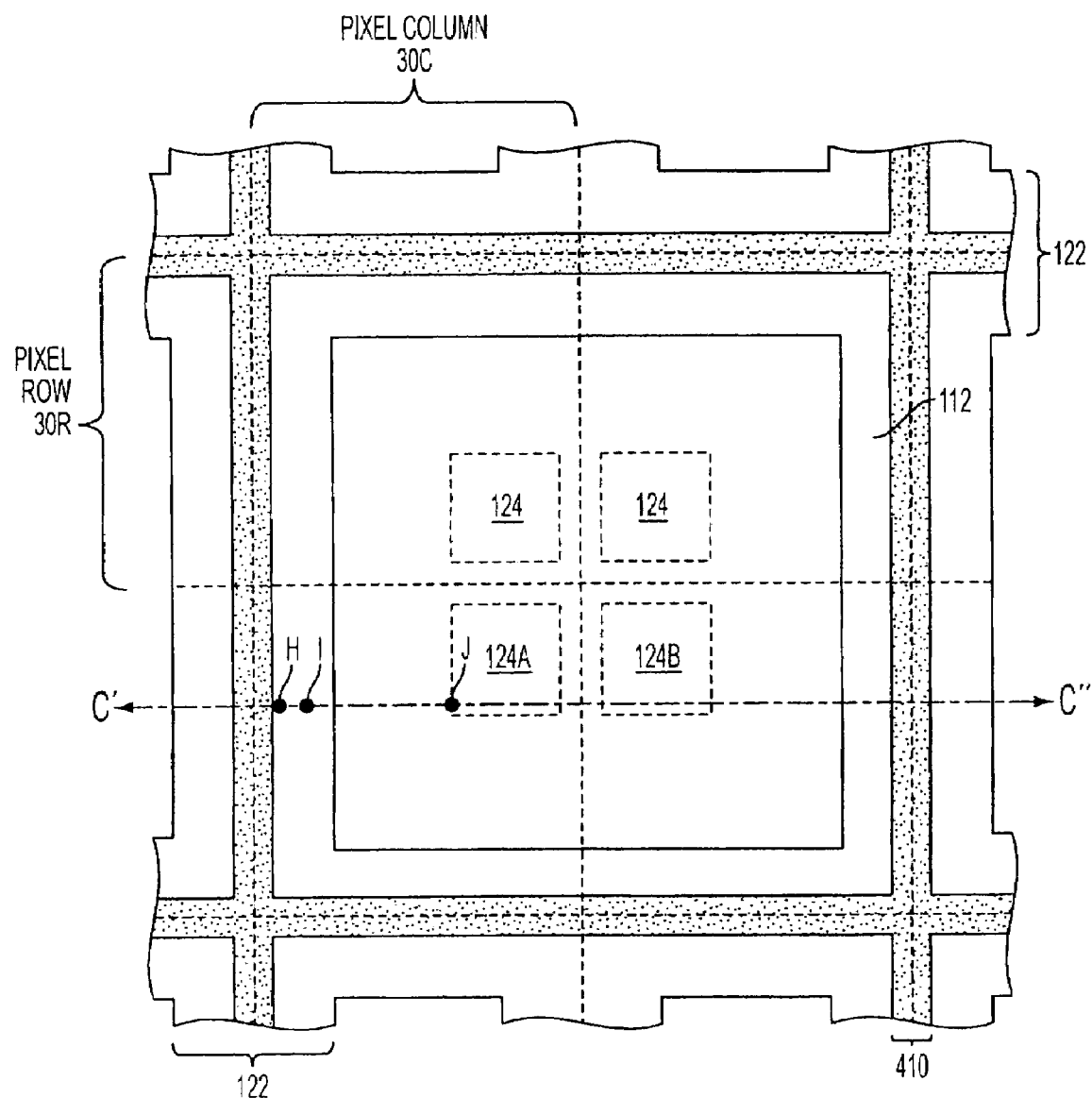
FIG. 9B is a top-down view illustrating a layout for microlenses of FIG. 9A.

FIG. 9A illustrates a non-limiting example of a third embodiment of a microlens system 900 having a combination of pairwise first microlenses 12A, 112B and second microlenses 122 for directing light to asymmetrically placed photosensors 124. FIG. 9B is a top-down layout view illustrating a non-limiting example of the microlens system 900. The cross section view of FIG. 9A is taken along line C'-C" of FIG. 9B. Initially, however, FIGS. 10A-B and 11A-B are provided to briefly explain such a use of pairwise lenses.

Figure 10A:
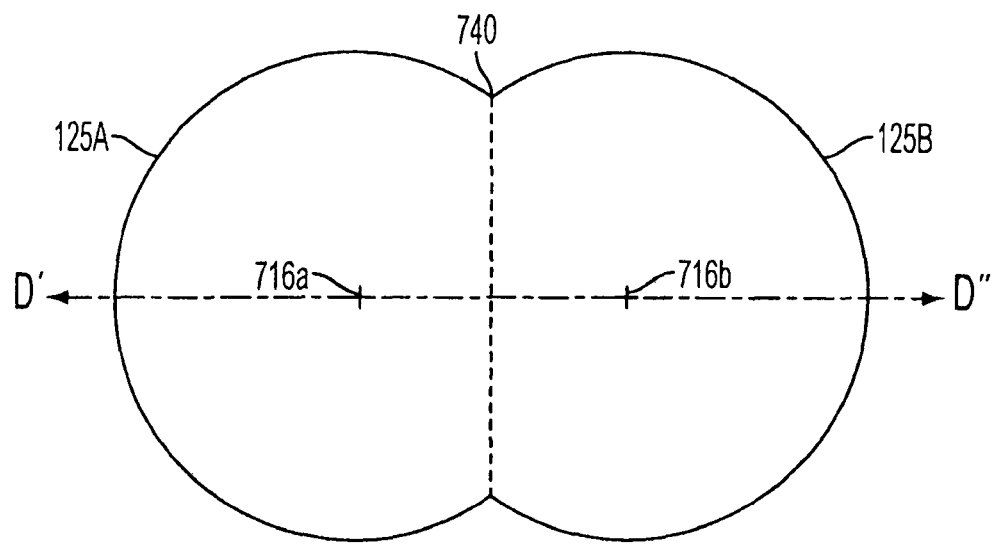
FIG. 10A is a top-down view illustrating conventional pairwise microlenses.
Figure 10B:
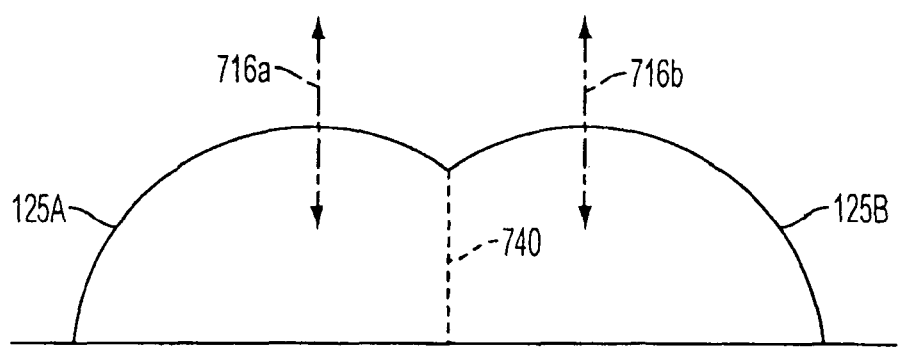
FIG. 10B is a cross-sectional view illustrating conventional pairwise microlenses.
Figure 11B:
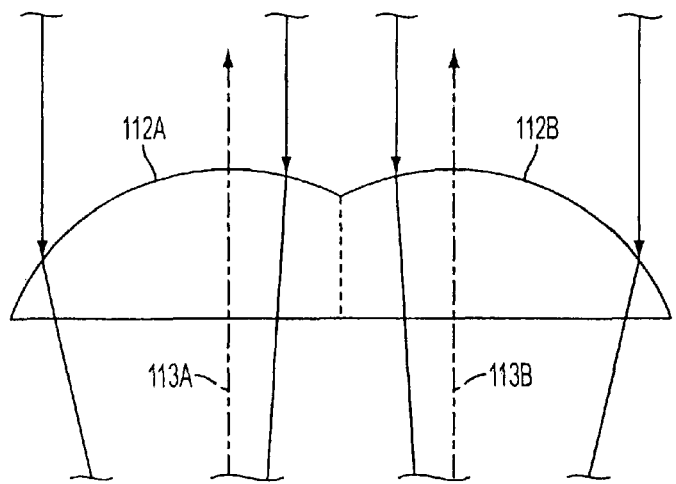
FIG. 11B is a cross-sectional view illustrating conventional pairwise microlenses for directing light to the photosensors of FIG. 11A.
Figure 11A:
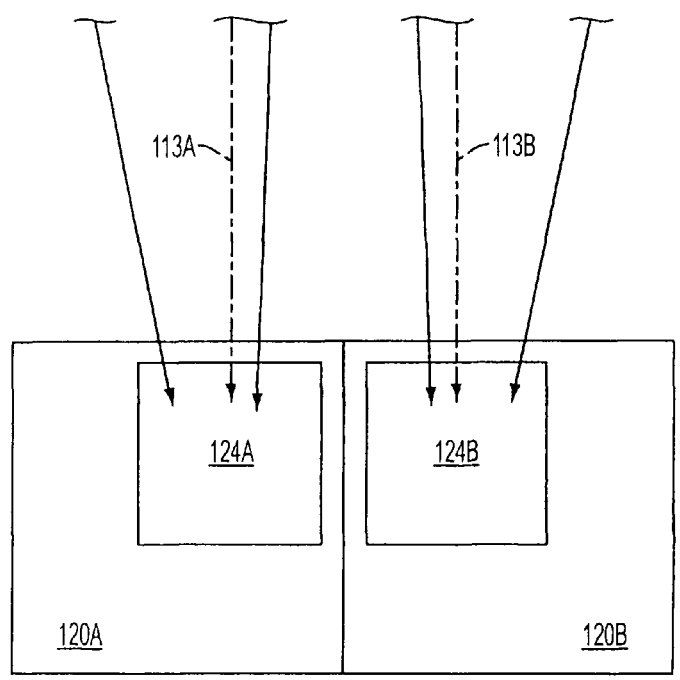
FIG. 11A is a top-down view illustrating a conventional pair of asymmetrically arranged photosensors.

FIGS. 10A and 10B are top-down and cross-sectional views, respectively, illustrating a non-limiting example of the pairwise microlenses 125A, 125B. The cross-sectional view of FIG. 10B is taken along the line D'-D" of FIG. 10A. As shown, the pairwise microlenses 125A, 125B contact one another at truncated sides shown by dashed line 740. The pairwise shape of the lenses 125A, 125B are a result of having their respective lens axes 716a, 716b spaced at a distance less than the sum of their radii. FIG. 11A is a top-down view illustrating a non-limiting example two pixel cells 120A, 120B having asymmetrically arranged photosensors 124A, 124B. FIG. 11B is a cross-sectional view illustrating a non-limiting example of pairwise first microlenses 112A, 112B having respective lens axes 113A, 113B passing through the optical centers of the photosensors 124A, 124B, which causes the first microlenses 112A, 112B to be positioned toward one another and thereby imparts their pairwise structure.

Referring back to FIGS. 9A and 9B, the pairwise first microlenses 112A, 112B can be supplemented by arranged second microlenses 122 to further compensate for the asymmetrical placement of the photosensors 124A, 124B. In other words, an asymmetrical placement of the second microlenses 122 is used to reduce the need for an asymmetrical placement of the first microlenses 112A, 112B. In this example, the second microlenses 122 are placed only at the pixel cell 120 edges furthest from the photosensors 124; and are not placed at the pixel cell 120 edges closest to the photosensors 124. As shown, an incident light beam L5a passes through a pairwise first microlens 112A and is directed as leaking light beam L5b to the second microlens 122, which in turn compensates for the insufficient refraction of the first microlens 112A by redirecting light beam L5b, as light beam L5c, onto the respective photosensor 124A. For example, as shown in FIG. 9B, incident light may enter the first microlens 112A at point H, be thereby redirected to enter a second microlens 122A at point I, and be thereby redirected to strike a photosensor 124A at point J. Incident light beam L6a enters the first microlens 112A at the same distance as incident light beam L5a from the optical axis 113A of the first microlens 112A, but the redirected light beam L6b does no: require further compensation from a second microlens (i.e., it is not a leaking light beam) because of the non-concentric arrangement of the optical axis 113A and photosensor 124.

Figure 12A:
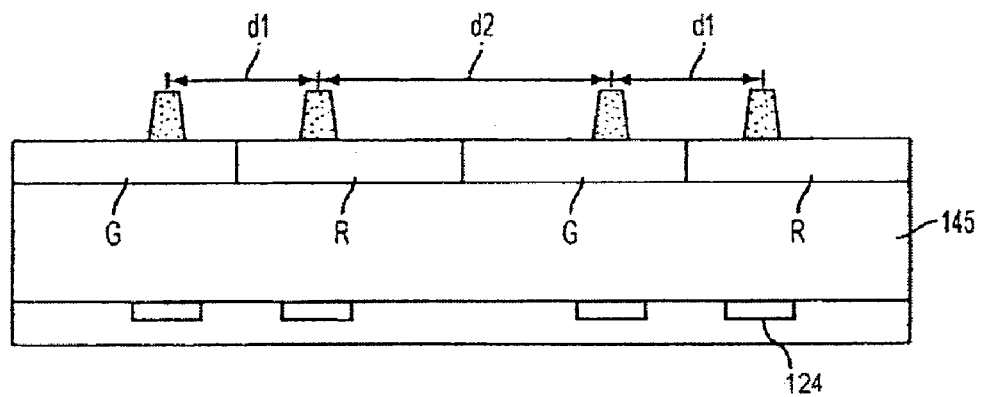
FIGS. 12A-B form a flow diagram illustrating a process for fabricating the pairwise microlenses.
Figure 12B:
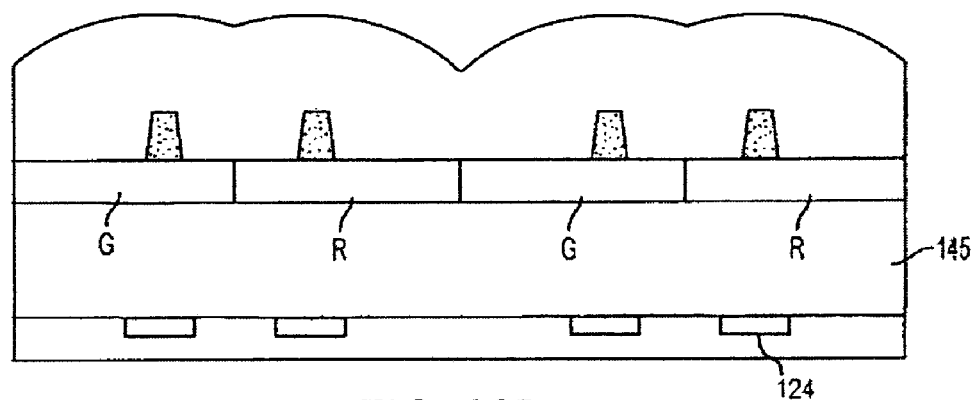

Pairwise lenses are difficult to fabricate with conventional reflow processes, because during melting the microlens material of the adjoining lenses can merge as one lens. Such issues can be avoided by fabricating pairwise microlenses via ALD. FIGS. 12A-B are flow diagrams illustrating a non-limiting example of a process for fabricating pairwise microlenses such as, for example, the pairwise first microlenses 112A, 112B of FIG. 9. For illustrative purposes, second microlenses 122 are not shown in FIGS. 12A and 12B. In FIG. 12A, the optical centers of the First microlenses 112 are shifted toward the optical centers of their respective photosensors 124. This may be achieved by providing shifted column-shaped seed pillars 411 used to form the first microlenses 112 for ALD formation. The pillars 411 are not equidistant from one another, but rather placed at different alternated distances of D1 and D2 from one another. As shown in FIG. 12B, due to the different distances of D1 and D2, the first microlenses 112 will have shifted optical centers so to form the pairwise microlens structure.

Figure 1:
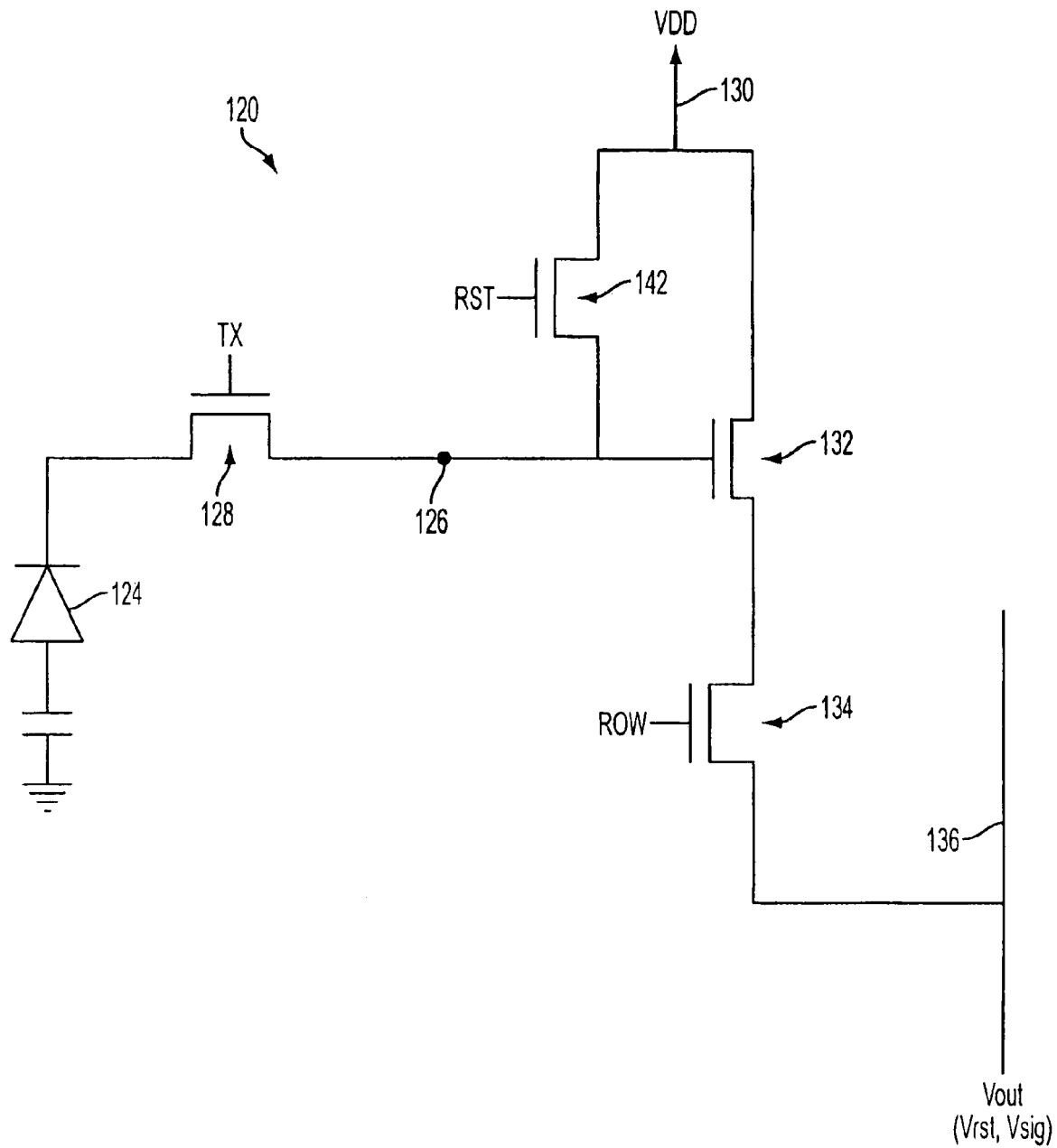
FIG. 1 is a circuit diagram illustrating a conventional CMOS pixel cell.
Figure 2:
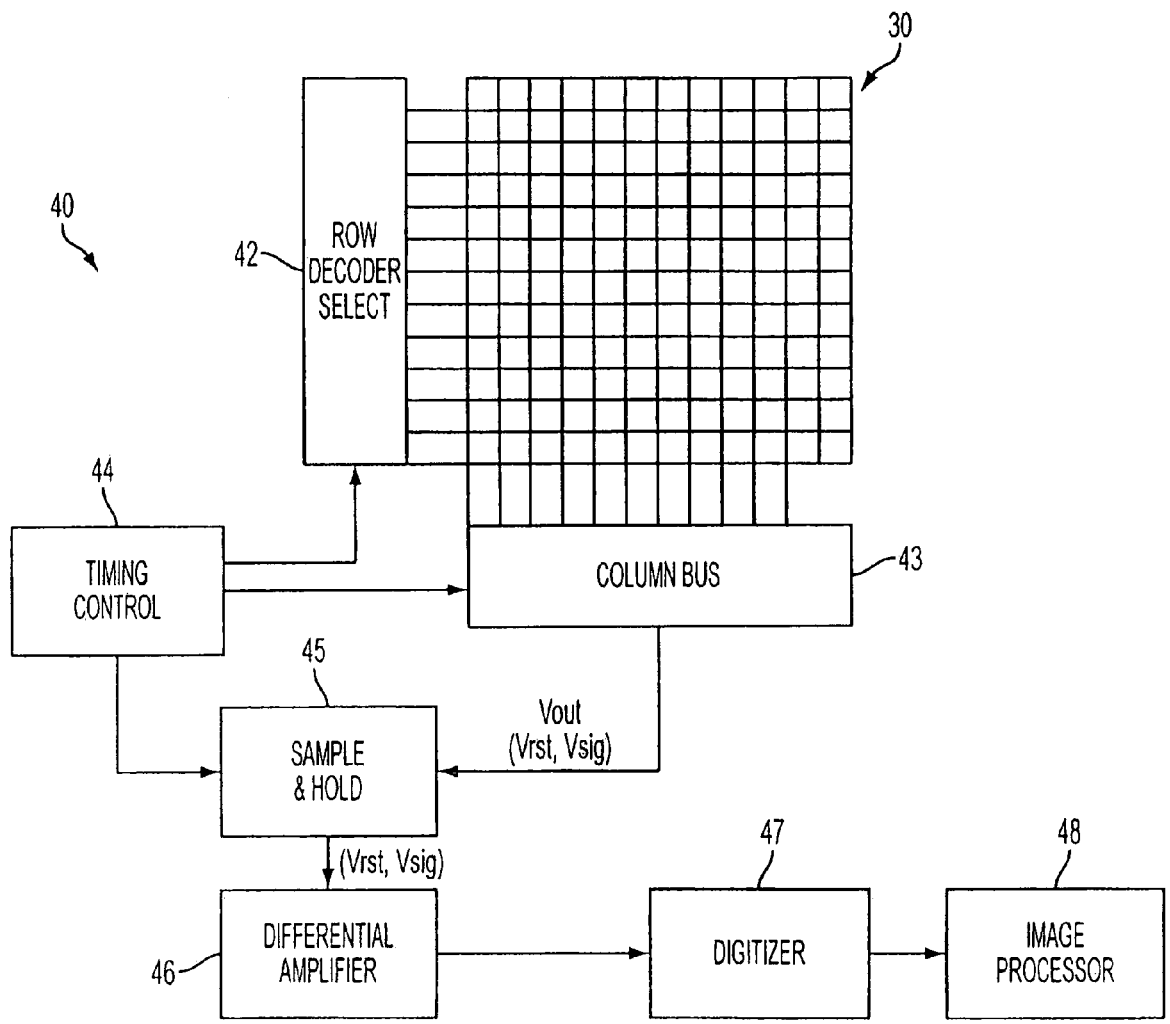
FIG. 2 is a block diagram illustrating a conventional CMOS imager system.
Figure 13:
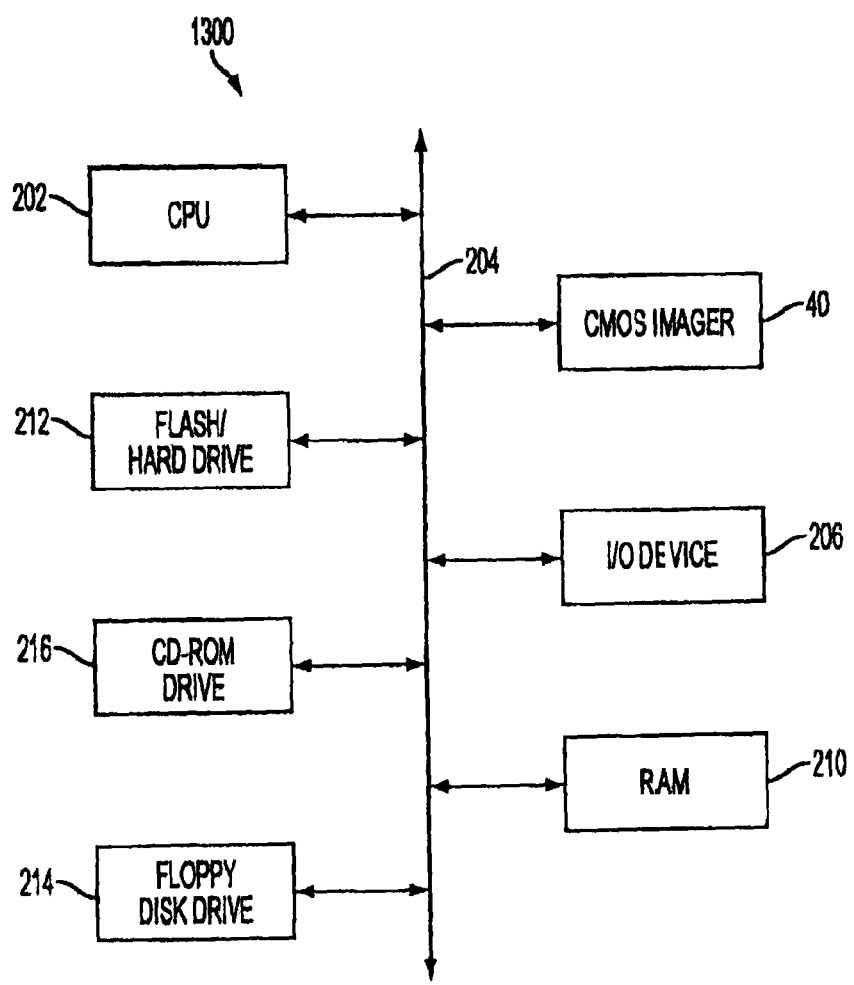
FIG. 13 is a block diagram illustrating an image processing system.

FIG. 13 is a block diagram illustrating a non-limiting example of a processing system 1300, which may include the CMOS imager device 40 (FIG. 2) implementing microlens systems in accordance with embodiments disclosed herein. The imager device 40 may also receive control or other data from system 1300. Examples of processor systems, which may employ the imager device 40 include, without limitation, computer systems, camera systems, scanners, machine vision systems, vehicle navigation systems, video telephones, surveillance systems, auto focus systems, star tracker systems, motion detection systems, image stabilization systems, and other imaging systems.

System 1300, for example a camera system, includes a central processing unit (CPU) 202 that communicates with various devices over a bus 204 to control the camera system. Some of the devices connected to the bus 204 provide communication into and out of the system 1300, illustratively including an input/output (I/O) device 206 and a CMOS imager device 30. Other devices connected to the bus 204 provide memory, illustratively including a random access memory system (RAM 210, FLASH memory or hard drive 212, and one or more peripheral memory devices such as a floppy disk drive 214 and compact disk read-only-memory (CD-ROM) drive 216. Any of the memory devices, such as the FLASH memory or hard drive 212, floppy disk drive 214, and CD-ROM drive 216 may be removable. The imager device 100 may be combined with a processor, such as a CPU, digital signal processor, or microprocessor, in a single integrated circuit. The imager device 30 may also be a CCD imager, rather than a CMOS imager or other type of solid state imager. Also, although the microlenses have been described as being fabricated for imagers, the invention may also be used to fabricate micro-lenses for display devices.

While various embodiments have been discussed and illustrated, the invention is not limited to these embodiments as various changes can be made thereto without departing form the spirit or scope of the invention which is defined by the appended claims.

What is claimed as new and desired to be protected by Letters Patent of the United States is:

1. An imaging device comprising:
   a plurality of pixel cells each comprising a respective photosensor for sensing light;
   a plurality of first microlenses for transmitting first light beams onto said photosensors; and
   a plurality of second microlenses for receiving second light beams from said first microlenses and transmitting said second light beams onto said photosensors,
   wherein said second microlenses direct said second light beams away from their respective lens axes, and said first microlenses direct said first light beams toward their respective lens axes.

2. The imaging device of claim 1, wherein:
   each of said first microlenses has a lens axis intersecting a respective one of said photosensors, and
   each of said second microlenses has a lens axis intersecting a region between an adjacent pair of said photo sensors.

3. The imaging device of claim 1, further comprising:
   an adjacent pair of said first microlenses having a pairwise configuration whereby a sum of respective radii of said pairwise first microlenses is greater than the distance between respective optical axes of said pairwise first microlenses.

4. The imaging device of claim 1, wherein each of said first microlenses is configured to receive a third light beam at an angle askew from its lens axis, and configured to refract and transmit said third light beam as said second light beam to a respective second microlens.

5. The imaging device of claim 1, wherein:
   at least one of said second microlenses receives said second light beams from each of an adjacent pair of said first microlenses.

6. The imaging device of claim 1, wherein said second microlenses are configured to compensate for an asymmetric placement of said photosensors within their respective pixel cells.

7. The imaging device of claim 1, wherein each of said second microlenses comprises:
   a transparent inner pillar, and
   a transparent outer layer deposited on said inner pillar.

8. The imaging device of claim 1, wherein each of said second microlenses has a plano-convex shape.

9. The imaging device of claim 1, wherein said first and second microlenses have a plano-convex shape.

10. The imaging device of claim 9, further comprising:
    a first transparent layer arranged under said second microlenses and over said photosensors; and
    a second transparent layer arranged under said first microlenses and over said second microlenses,
    wherein said second transparent layer has a greater refractive index than said second microlenses.

11. The imaging device of claim 10, wherein said first transparent layer has a lower refractive index than said second transparent layer.

12. The imaging device of claim 10, wherein said first microlenses have a greater refractive index than said second microlenses. second transparent layer has a lower refractive index than said second transparent layer.

13. A method of forming an imaging system, comprising:
    forming a plurality of photosensors for sensing light; forming a plurality of convex microlenses having respective lens axes intersecting said photosensors; and forming a plurality of concave microlenses having respective lens axes intersecting regions between said photosensors; and wherein each of said first and second microlenses have a plano-convex-shaped shape; and further comprising: forming a first transparent layer over said photosensors; forming said second microlenses over said first transparent layer; forming a second transparent layer over said second microlenses; and forming said first microlenses over said second transparent layer, wherein at least one of said first microlenses and said second transparent layer has a greater refractive index than at least one of said second microlenses and said first transparent layer.

14. The method of claim 13, wherein said refractive indexes of said first transparent layer and said second microlenses are substantially equal and said refractive indexes of said second transparent layer and said first microlenses are substantially equal.

15. The method of claim 13, wherein:
    said first transparent layer and said second microlenses each have a refractive index of about n=1.45 or less, and said second transparent layer and said first microlenses each have a refractive index of about n=1.9 or greater.

16. The method of claim 13, wherein said second microlenses have a lower refractive index than said first microlenses.

17. The method of claim 13, wherein said second transparent layer has a higher refractive index than said second microlenses.

18. The method of claim 13, wherein said first and second microlenses are formed by a conformal deposition technique.

19. The method of claim 18, wherein said first and second microlenses are formed by atomic layer deposition.

20. The method of claim 19, further comprising:
    forming an adjacent pair of said first microlenses having a pairwise configuration, whereby a sum of respective radii of said pairwise first microlenses is greater than the distance between respective optical axes of said pairwise first microlenses.

21. A imaging system comprising:
    a processor for controlling operations of said imager system;
    an imager device; and
    a camera lens for focusing light on said imager device,
    wherein said imager device comprises:
    an array of photosensors for sensing light;
    an array of first microlenses for redirecting first and second portions of light, wherein said first portion of light redirected by said first microlens is directed at said photosensors and said second portion of light redirected by said first microlens is not directed at said photosensors; and
    an array of second microlenses for redirecting said second portion of light onto said photosensors,
    wherein respective optical centers of said first and second microlenses are not aligned.

22. The imaging system of claim 21, wherein said first microlenses are configured to direct said light toward their respective lens axes and said second microlenses are configured to direct said light away from their respective lens axes.

23. The imaging system of claim 21, wherein each of said first microlenses has a lens axis intersecting a respective one of said photosensors, and
    each of said second microlenses has a lens axis intersecting a region between an adjacent pair of said photosensors.

24. The imaging system of claim 21, wherein each of said first microlenses is configured to receive said second portion of light from said camera lens at an angle askew from its lens axis.

25. The imaging system of claim 21, wherein each of said second microlenses has plano-convex shape, said second portion of light is transmitted through a first medium, and said first medium has a greater refractive index than said second microlenses.

26. The imaging system of claim 21, wherein each of said second microlenses is configured to compensate for an asymmetrical placement of said photosensors within said pixel cells.

27. The imaging system of claim 21, further comprising:
   a first transparent layer over said photosensors and under said second microlenses;
   a second transparent layer over said second microlenses and under said first microlenses,
   wherein said second microlenses have a lower refractive index than said second transparent layer.

28. The imaging system of claim 27, wherein said refractive indexes of said first transparent layer and said second microlenses are substantially equal and said refractive indexes of said second transparent layer and said first microlenses are substantially equal.

29. The imaging system of claim 27, wherein said first transparent layer has a lower refractive index than said second transparent layer.

30. The imaging system of claim 21, further comprising: an adjacent pair of said first microlenses having a pairwise configuration, whereby a sum of respective radii of said pairwise first microlenses is greater than the distance between respective optical axes of said pairwise first microlenses.

* * * * *